(12) United States Patent
Liu et al.

(10) Patent No.: US 9,966,032 B2
(45) Date of Patent: May 8, 2018

(54) DRIVING CIRCUIT AND DRIVING METHOD

(71) Applicant: CHUNGHWA PICTURE TUBES, LTD., Taoyuan (TW)

(72) Inventors: Han-Lung Liu, Taichung (TW); Wei-Lien Sung, Taitung County (TW); Wen-Chuan Wang, New Taipei (TW); Shao-Lun Chang, New Taipei (TW); Shih-Chieh Lin, Taipei (TW)

(73) Assignee: CHUNGHWA PICTURE TUBES, LTD., Taoyuan (TW)

( * ) Notice: Subject to any disclaimer, the term of this patent is extended or adjusted under 35 U.S.C. 154(b) by 227 days.

(21) Appl. No.: 15/088,137

(22) Filed: Apr. 1, 2016

(65) Prior Publication Data
US 2017/0193957 A1 Jul. 6, 2017

(30) Foreign Application Priority Data

Jan. 4, 2016 (CN) .......................... 2016 1 0003956

(51) Int. Cl.
*G09G 3/36* (2006.01)
*G11C 19/28* (2006.01)
*G11C 19/18* (2006.01)

(52) U.S. Cl.
CPC ......... *G09G 3/3696* (2013.01); *G09G 3/3688* (2013.01); *G11C 19/184* (2013.01); *G11C 19/28* (2013.01); *G09G 2300/0426* (2013.01); *G09G 2300/0809* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| 2005/0134545 A1* | 6/2005 | Jang | G09G 3/3688 345/100 |
| 2008/0279327 A1* | 11/2008 | Liu | G11C 19/184 377/64 |
| 2009/0122951 A1* | 5/2009 | Tobita | G11C 19/184 377/68 |

(Continued)

FOREIGN PATENT DOCUMENTS

| JP | 2009-099777 A | 5/2009 |
| TW | 200842792 A | 11/2008 |
| TW | I406234 B | 8/2013 |

*Primary Examiner* — Kent Chang
*Assistant Examiner* — Benjamin Morales Fernande
(74) *Attorney, Agent, or Firm* — CKC & Partners Co., Ltd.

(57) ABSTRACT

A driving circuit in this disclosure includes plural stages of shift register circuits. Every stage in the shift register circuits includes an enabling control circuit, a first output circuit, a second output circuit and a disabling control circuit. The enabling circuit is configured to control the voltage of the first operation node according to enabling signal. The first output unit is configured to generate the first driving signal according to the voltage of the first operation node and the first clock signal. The second output unit is configured to generate the second driving signal according to the voltage of the first operation node and the second clock signal. The disabling control unit is used to pull low the voltage of the first operation node and output terminal of the first and second output unit to the reference voltage according to the first, third, and fourth clock signals.

10 Claims, 5 Drawing Sheets

(56) References Cited

U.S. PATENT DOCUMENTS

| | | | |
|---|---|---|---|
| 2009/0303211 A1* | 12/2009 | Hu | G11C 19/28 |
| | | | 345/204 |
| 2012/0200544 A1* | 8/2012 | Iwamoto | G09G 3/3685 |
| | | | 345/204 |
| 2013/0009856 A1* | 1/2013 | Takahashi | G11C 19/184 |
| | | | 345/92 |
| 2014/0119491 A1* | 5/2014 | Liu | G11C 19/28 |
| | | | 377/64 |
| 2015/0187323 A1* | 7/2015 | Jin | G09G 5/003 |
| | | | 345/215 |
| 2015/0221265 A1 | 8/2015 | Huang et al. | |
| 2016/0086562 A1* | 3/2016 | Tan | G09G 3/3677 |
| | | | 345/215 |
| 2016/0104449 A1* | 4/2016 | Huang | G11C 19/28 |
| | | | 345/212 |
| 2016/0125954 A1* | 5/2016 | Gu | G11C 19/28 |
| | | | 377/64 |
| 2016/0189586 A1* | 6/2016 | Zou | G09G 3/3266 |
| | | | 345/213 |
| 2017/0061922 A1* | 3/2017 | Wang | G11C 19/184 |

* cited by examiner

DRIVING CIRCUIT AND DRIVING METHOD

RELATED APPLICATIONS

This application claims priority to Chinese Application Serial Number 201610003956.6, filed Jan. 4, 2016, the disclosures of which are incorporated herein by reference in their entireties.

BACKGROUND

Field of Invention

The present disclosure relates to a driving circuit and a driving method thereof. More particularly, the present disclosure relates to a driving circuit which occupies less circuitry space.

Description of Related Art

In general, a liquid crystal display includes multiple pixel units, gate driving circuits and source driving circuits. Source driving circuits are configured to provide multiple data voltage signals. Gate driving circuits include multiple stages of shift register circuits, which are configured to provide multiple gate signals. The gate signals are utilized to control on/off states of pixel transistors in the pixel units and further to control processes of writing data voltage signals into the pixel units.

Output transistors, in each stage of the shift register circuits, are controlled by operational voltages and configured for sequentially generating gate driving signals. The space occupied by the shift register circuits is smaller than a traditional wiring structure of a gate driver without shift registers. However, with the development of the display technology, the display is developed to include more and more components. Therefore, it is a critical issue to optimize arrangement of the components within the display and achieve better area efficiency.

SUMMARY

The disclosure provides a driving circuit and a driving method thereof. The circuit area can be substantially reduced by sharing enabling control units and disabling control unit of shift register circuits in the driving circuit.

A driving circuit is disclosed in some embodiments of this disclosure. The driving circuit includes multiple stages of shift register circuits. The shift register circuits are configured to output sequential driving signals. Each stage of the shift register circuits includes an enabling control unit, a first output unit, a second output unit and a disabling control unit.

The enabling control unit is configured to control the voltage of a first operation node according to an enabling signal. The first output unit is electrically coupled to the first operation node, and the first output unit is configured to generate the first driving signal at the output of the first output unit according to the voltage level of the first operation node and a first clock signal. The second output unit is electrically coupled to the first operation node, and the second output unit is configured to generate a second driving signal at the output of the second output unit according to the voltage level of the first operation node and a second clock signal.

The disabling control unit is electrically coupled to the first output unit and the second output unit, wherein the disabling control unit is configured to lower the voltage level of the first operation node, the output of the first output unit, and the output of the second output unit to a reference voltage level according to the first clock signal, a third clock signal, and a fourth clock signal. The first clock signal and the third clock signal are complementary, and the second clock signal and the fourth clock signal are complementary.

A driving method is disclosed in some embodiments of this disclosure. The driving method is configured to drive the shift register circuit in each stage of aforesaid driving circuit. The driving method includes following steps. In a first time interval, the enabling control unit is driven by the enabling signal for configuring the first operation node to a first enabling level. In a second time interval after the first time interval, the first clock signal is enabled for triggering the first output unit to generate a first driving signal at an output terminal of the first output unit, and the first operation node is configured to a second enabling level. In a third time interval after the second time interval, the second clock signal is enabled for triggering the second output unit to generate a second driving signal at the output terminal of the second output unit, and the first operation node is configured to a third enabling level. In a fourth time interval after the third time interval, the third clock signal is disabled for configuring the first operation node to the second enabling level. After the fourth time interval, the voltage level of the first operation node is pulled low to the reference voltage level by the reset signal, and the control unit is disabled by the first clock signal, so as to maintain the first operation node at the reference voltage level.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
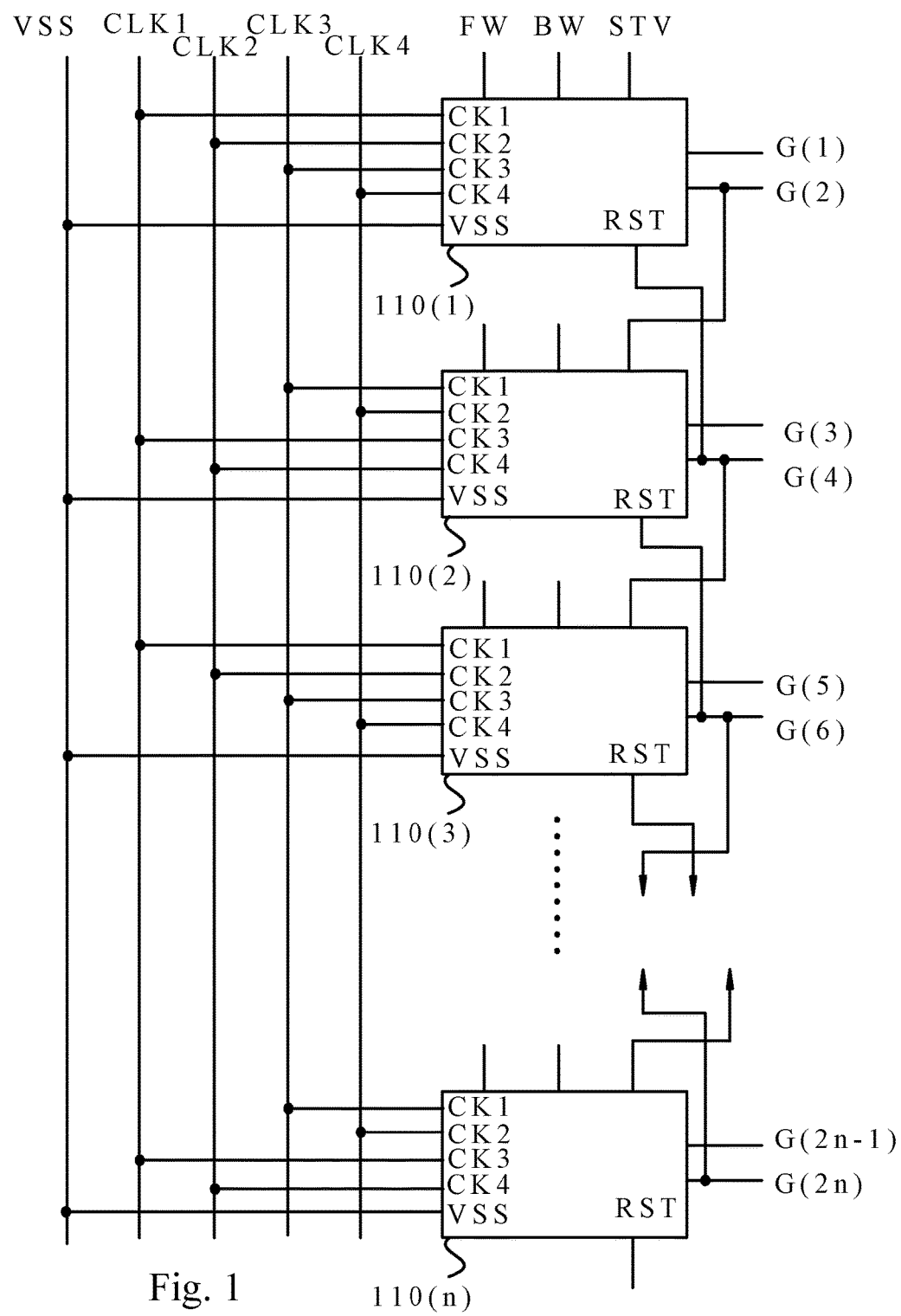
FIG. 1 is a schematic diagram illustrating a driving circuit according to one embodiment of the disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Reference is made to FIG. 1, which is a schematic diagram illustrating a driving circuit 100 according to one embodiment of the disclosure. The driving circuit 100 comprises a first stage of shift register circuits 110(1), a second stage of shift register circuits 110(2) . . . , and an N-th stage of shift register circuits 110(n), where N, n are positive integers. Aforesaid stages of the shift register circuits 110(1)-110(n) are configured to generate sequential driving signals G(1)-G(2n). The driving circuit 100 includes four clock sources CLK1, CLK2, CLK3 and CLK4. The clock sources CLK1, CLK2, CLK3 and CLK4 are configured to provide clock signals CK1-CK4 to the shift register circuits 110(1)-110(n).

It is noted that, each stage of the shift register circuits 110(1)-110(n) in the embodiment shown in FIG. 1 generates two driving signals. For example, the first stage of the shift register circuits 110(1) generates driving signals G(1) and G(2); the second stage of the shift register circuits 110(2) generates driving signals G(3) and G(4); and the N-th stage of the shift register circuits 110(n) generates driving signals G(2n−1) and G(2n). In other embodiments, each stage of the shift register circuits 110(1)-110(n) may generate three or more driving signals. The shift register circuits 110(1)-110(n) have corresponding circuit structure, and the shift register circuits 110(1)-110(n) are electrically coupled in sequential way to deliver essential signals.

Regarding to the specific circuit structure and the method of delivering signals, the N-th stage of shift register circuit will be taken as a representative in the following description. Each of the driving signals G(1)-G(2N) can be separately delivered to pixel arrays (not shown) through the scan lines (not shown) connected to the driving circuit 100. The driving signals G(1)-G(2N) are configured to turn on the pixel transistors (not shown) connected to the scan lines, so as to control the pixel units (not shown) in the pixel arrays.

Reference is made to FIG. 2, which is a schematic diagram illustrating the N-th stage of the shift register circuits 200 according to one embodiment of the disclosure. The N-th stage of the shift register circuits 200 can be applied to the N-th stage of the shift register circuits 110(n) shown in FIG. 1. The N-th stage shift register circuit 200 includes an enabling control unit 210, a first output unit 220, a second output unit 230 and a disabling control unit 240.

The enabling control unit 210 is configured to control the voltage of a first operation node Q according to an enabling signal STV. In some embodiments, the enabling control unit 210 is also configured to control the voltage of the first operation node Q according to a reset signal RST.

Figure 2A:
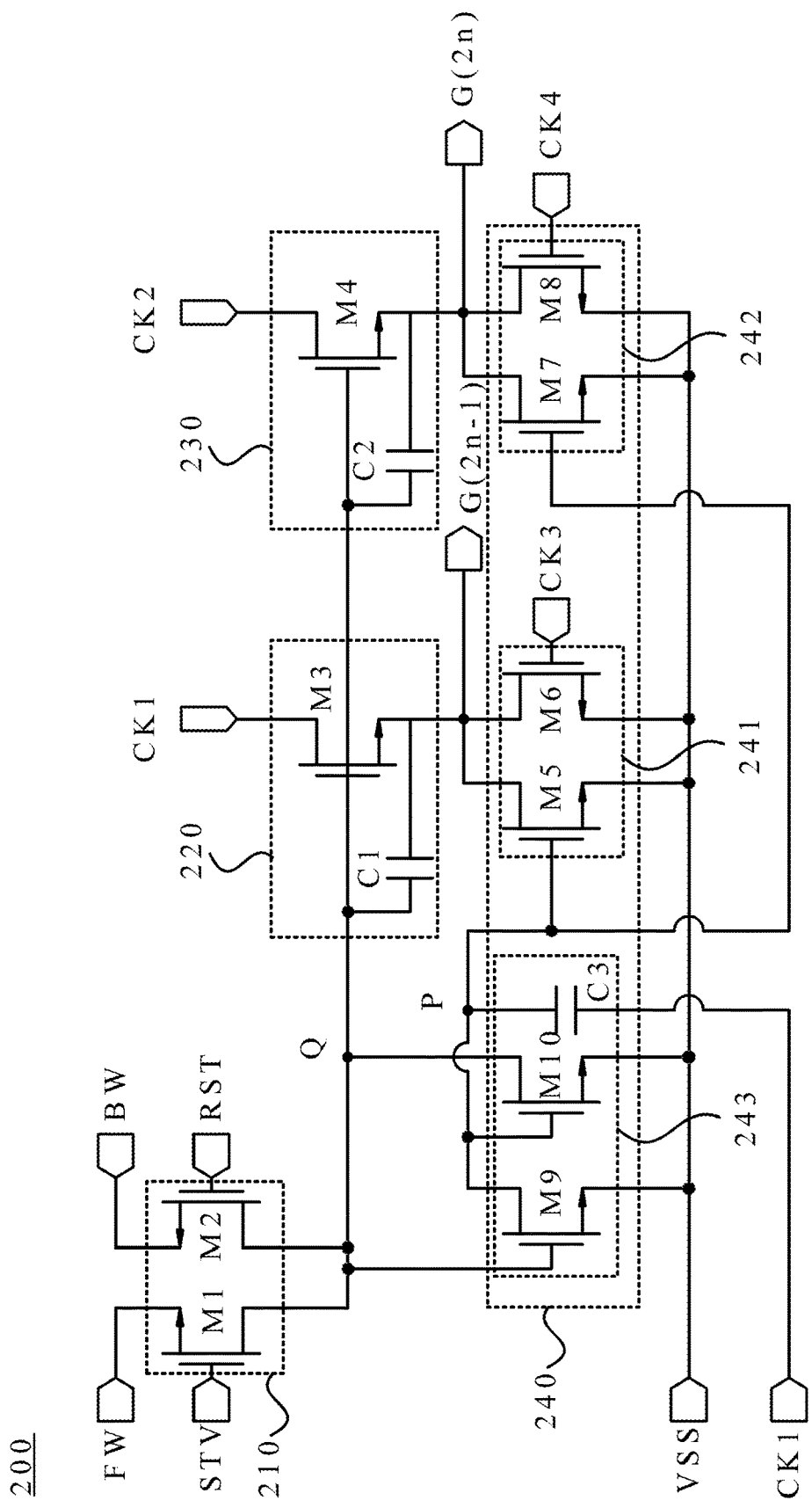
FIG. 2A is a schematic diagram illustrating the N-th stage of shift register circuits according to one embodiment of the disclosure.

Furthermore, as shown in FIG. 2A, the enabling control unit 210 includes a first transistor M1 and a second transistor M2. A control terminal of the first transistor M1 is configured to receive the enabling signal STV. A first terminal of the first transistor M1 is electrically coupled to the first operation node Q. A second terminal of the first transistor M1 is configured to receive a first operation voltage FW. A control terminal of the second transistor M2 is configured to receive the reset signal RST. A first terminal of the M2 is electrically coupled to the first operation node Q. A second terminal of the second transistor M2 is configured to receive a second operation voltage BW. In this embodiment, the first operation voltage FW is at logic-high level, and the second operation voltage BW is at logic-low level. In other embodiments, the logic level of the first operation voltage FW and the second operation voltage BW can be selected arbitrarily.

The first transistor M1, the second transistor M2 and other transistors in the following description are regarded as n-type Metal-Oxide-Semiconductor Field-Effect Transistors (nMOSFETs) for convenience. In practice, the first transistor M1, the second transistor M2, and other transistors in the following description may be p-type Metal-Oxide-Semiconductor Field-Effect Transistors (pMOSFETs), n-type bipolar junction transistors, p-type bipolar junction transistors or other equivalent transistors.

The first output unit 220 is electrically coupled to the first operation node Q, and the first output unit 220 is configured to generate the first driving signal G(2n−1) of the driving signals G(1)-G(2N) at the output terminal of the first output unit 220 according to the voltage of the first operation node Q and a first clock signal CK1. The second output unit 230 is electrically coupled to the first operation node Q, and the second output unit 230 is configured to generate the first driving signal G(2n) of the driving signals G(1)-G(2N) at the output terminal of the second output unit 230 according to the voltage of the first operation node Q and a second clock signal CK2.

Moreover, as shown in FIG. 2A, the first output unit 220 includes a third transistor M3 and a first capacitor C1. A control terminal of the third transistor M3 is electrically coupled to the first operation node Q, a first terminal of the third transistor M3 is electrically coupled to the disabling control unit 240, and a second terminal of the third transistor M3 is configured to receive the first clock signal CK1. A first terminal of the first capacitor C1 is electrically coupled to the control terminal of the third transistor M3, and a second terminal of the third transistor M3 is electrically coupled to the first terminal of third transistor M3. The second output unit 230 includes a fourth transistor M4 and a second capacitor C2. A control terminal of the fourth transistor M4 is electrically coupled to the first operation node Q. A first terminal of the fourth transistor M4 is electrically coupled to the disabling control unit 240. A second terminal of the fourth transistor M4 is configured to receive the second clock signal CK2. A first terminal of the second capacitor C2 is electrically coupled to the control terminal of the fourth transistor M4. A second terminal of the second capacitor C2 is electrically coupled to the first terminal of fourth transistor M4.

In some embodiments, the second driving signal G(2)-G(2n) in each stage of the shift register circuits 110(1)-110(n) is utilized as the enabling signal STV in next stage of the shift register circuits 110(1)-110(n) as the circuitry connection illustrated in FIG. 1. For example, the second driving signal G(2) of the 1st stage of the shift register circuits 110(1) is utilized as the enabling signal STV of the 2nd the shift register circuits 110(2). For example, the second driving signal G(4) of the 2nd stage of the shift register circuits 110(2) is utilized as the enabling signal STV of the 3rd the shift register circuits 110(3). The second driving signal G(2)-G(2n) in each stage of the shift register circuits 110(1)-110(n) is utilized as the reset signal RST in previous stage of the shift register circuits as the circuitry connection illustrated in FIG. 1. For example, the second driving signal G(4) of the 2nd stage of the shift register circuits 110(2) is utilized as the reset signal RST of the 1st stage of the shift register circuits 110(1). For example, the second driving signal G(6) of the 3rd stage of the shift register circuits 110(3) is utilized as the reset signal RST of the 2nd stage of the shift register circuits 110(2).

The disabling control unit 240 is electrically coupled to the first output unit 220 and second output unit 230, and the disabling control unit 240 is configured to lower the voltage level of the first operation node Q, the output of the first output unit 220, and the output of the second output unit 230 to a reference voltage level VSS according to the first clock signal CK1, a third clock signal CK3, and a fourth clock signal CK4. The first clock signal CK1 and the third clock signal CK3 are complementary to each other. The second clock signal CK2 and the fourth clock signal CK4 are complementary to each other.

Additionally, as shown in FIG. 2A, the disabling control unit 240 includes a first disabling circuit 241, a second disabling circuit 242, and a third disabling circuit 243. The first disabling circuit 241 includes a fifth transistor M5 and a sixth transistor M6. A control terminal of the fifth transistor M5 is electrically coupled to a second operation node P, a first terminal of the fifth transistor M5 is configured to receive the reference voltage level VSS, and a second terminal of the fifth transistor M5 is electrically coupled to the output terminal of the first output unit 220. A control terminal of the sixth transistor M6 is configured to receive the third clock signal CK3, a first terminal of the sixth transistor M6 is configured to receive the reference voltage level VSS, and a second terminal of the sixth transistor M6 is electrically coupled to the output terminal of the first output unit 220.

The second disabling circuit 242 includes a seventh transistor M7 and an eighth transistor M8. A control terminal of the seventh transistor M7 is electrically coupled to the second operation node P, a first terminal of the seventh transistor M7 is configured to receive the reference voltage level VSS, and a second terminal of the seventh transistor M7 is electrically coupled to the output terminal of the second output unit 230. A control terminal of the eighth transistor M8 is configured to receive the fourth clock signal CK4, a first terminal of the eighth transistor M8 is configured to receive the reference voltage level VSS, and a second terminal of the eighth transistor M8 is electrically coupled to the output terminal of the second output unit 230.

The third disabling circuit 243 includes a ninth transistor M9, a tenth transistor M10, and a third capacitor C3. A control terminal of the ninth transistor M9 is electrically coupled to the first operation node Q, a first terminal of the ninth transistor M9 is configured to receive the reference voltage level VSS, and a second terminal of the ninth transistor M9 is electrically coupled to the second operation node P. A control terminal of the tenth transistor M10 is electrically coupled to the second operation node P, a first terminal of the tenth transistor M10 is configured to receive the reference voltage level VSS, and a second terminal of the tenth transistor M10 is electrically coupled to the first operation node Q. A first terminal of the third capacitor C3 is electrically coupled to the second operation node P, and a second terminal of the third capacitor C3 is configured to receive the first clock signal CK1.

Figure 2B:
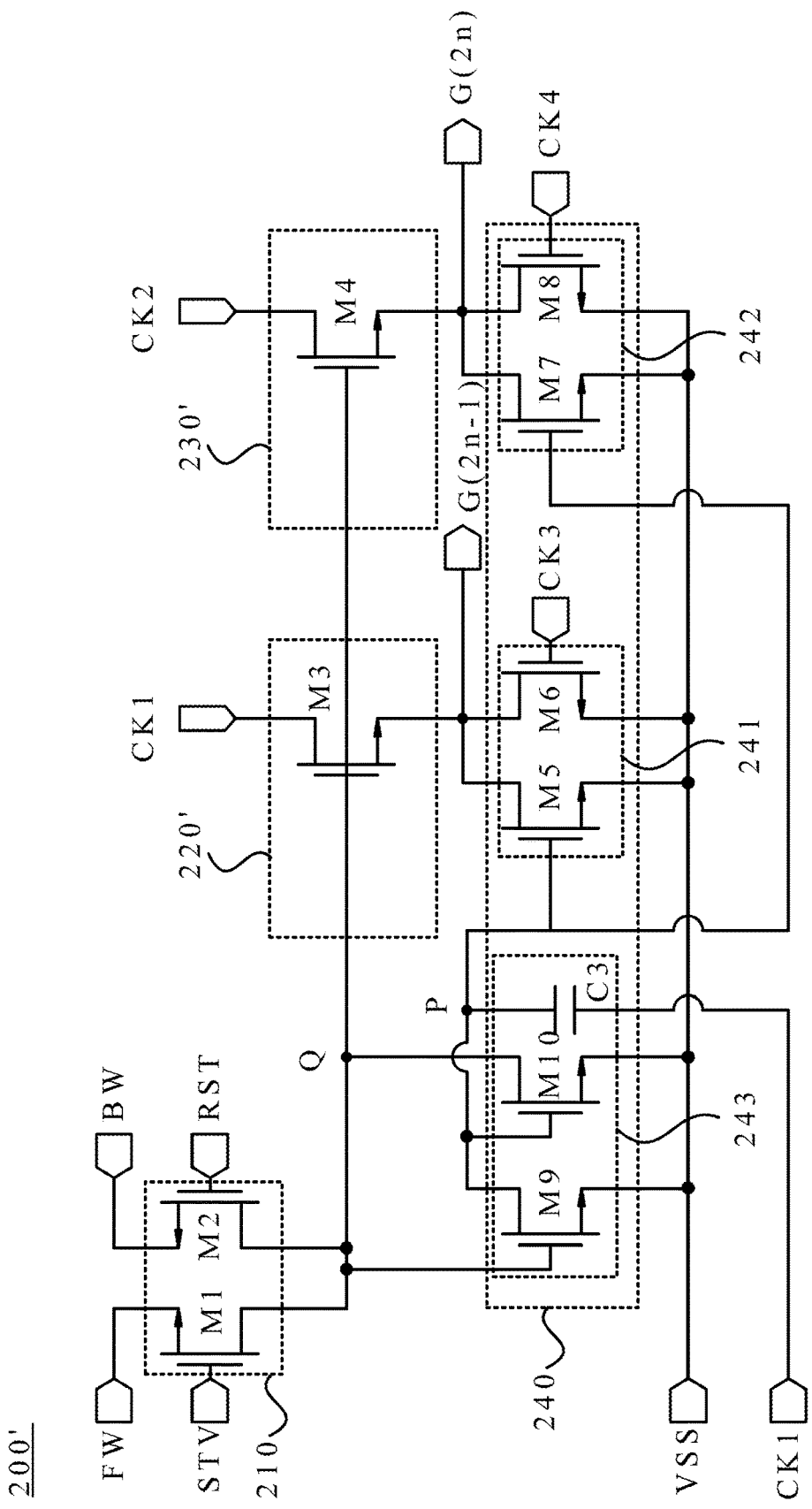
FIG. 2B is a schematic diagram illustrating the N-th stage of shift register circuits according to another embodiment of the disclosure.

In some embodiments, the first output unit 220 and the first capacitor C1 and the second capacitor C2 in the second output unit 230 can be omitted. Reference is made to FIG. 2B, which is a diagram of an N-th stage shift register circuit 200' according to an embodiment of the disclosure. The N-th stage shift register circuit 200 can be applied to the N-th stage shift register circuit 110(n) shown in FIG. 1. The 200' also includes the 210 and the 240, but a first output unit 220' and a second output unit 230' do not include the first capacitor C1 and the second capacitor C2.

From the viewpoint of circuit analysis, the effective capacitance of the circuit looking from the first operation node Q includes an input capacitance Cgs3 of the third transistor M3 and an input capacitance Cgs4 of the fourth transistor M4. The effective capacitance is sufficient for maintaining proper operation of the first operation node Q. Hence, in this embodiment, the circuit area can be reduced substantially by reducing capacitors in output units.

Figure 3A:
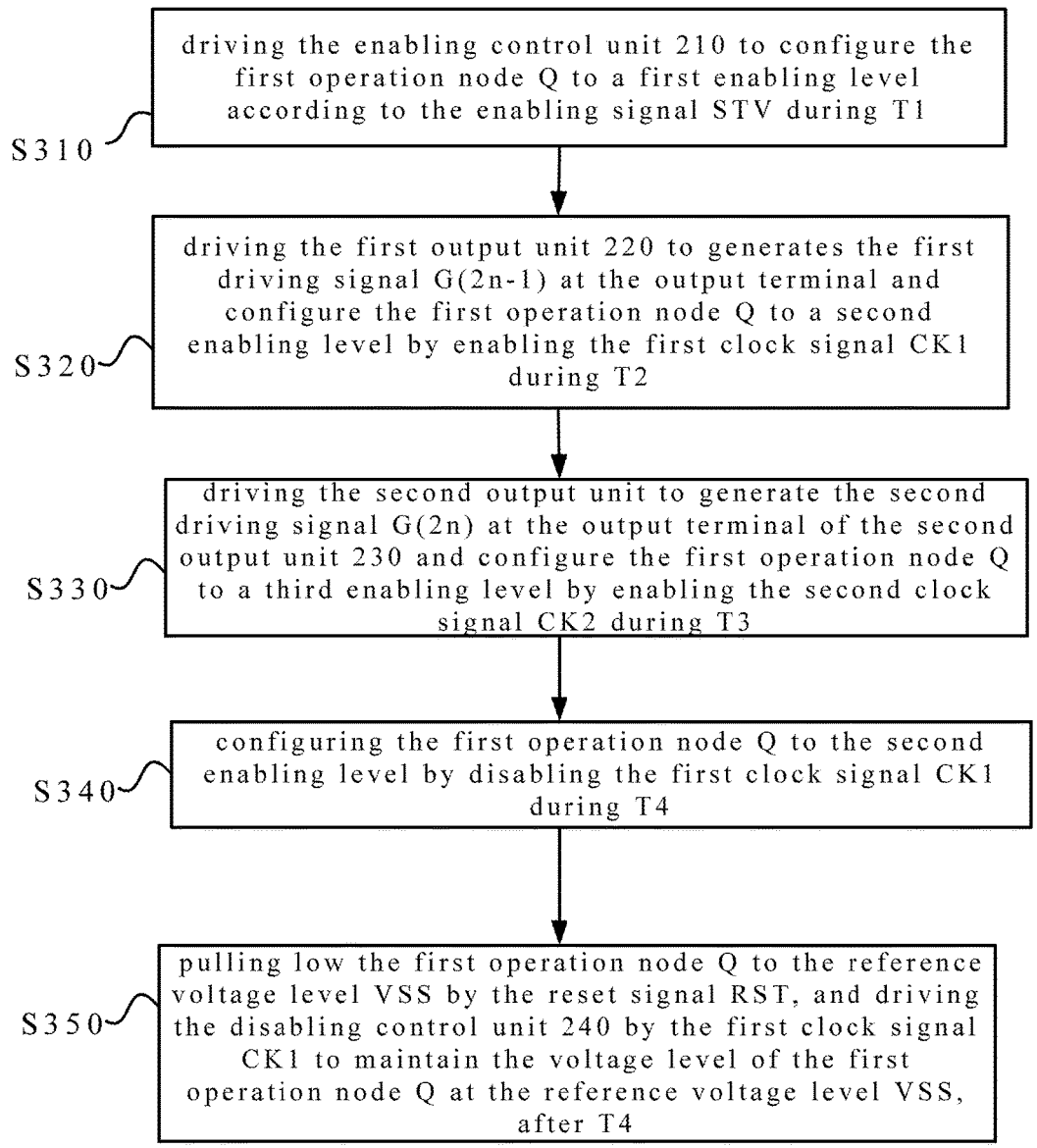
FIG. 3A is a flow chart illustrating a driving method according to one embodiment of the disclosure.
Figure 3B:
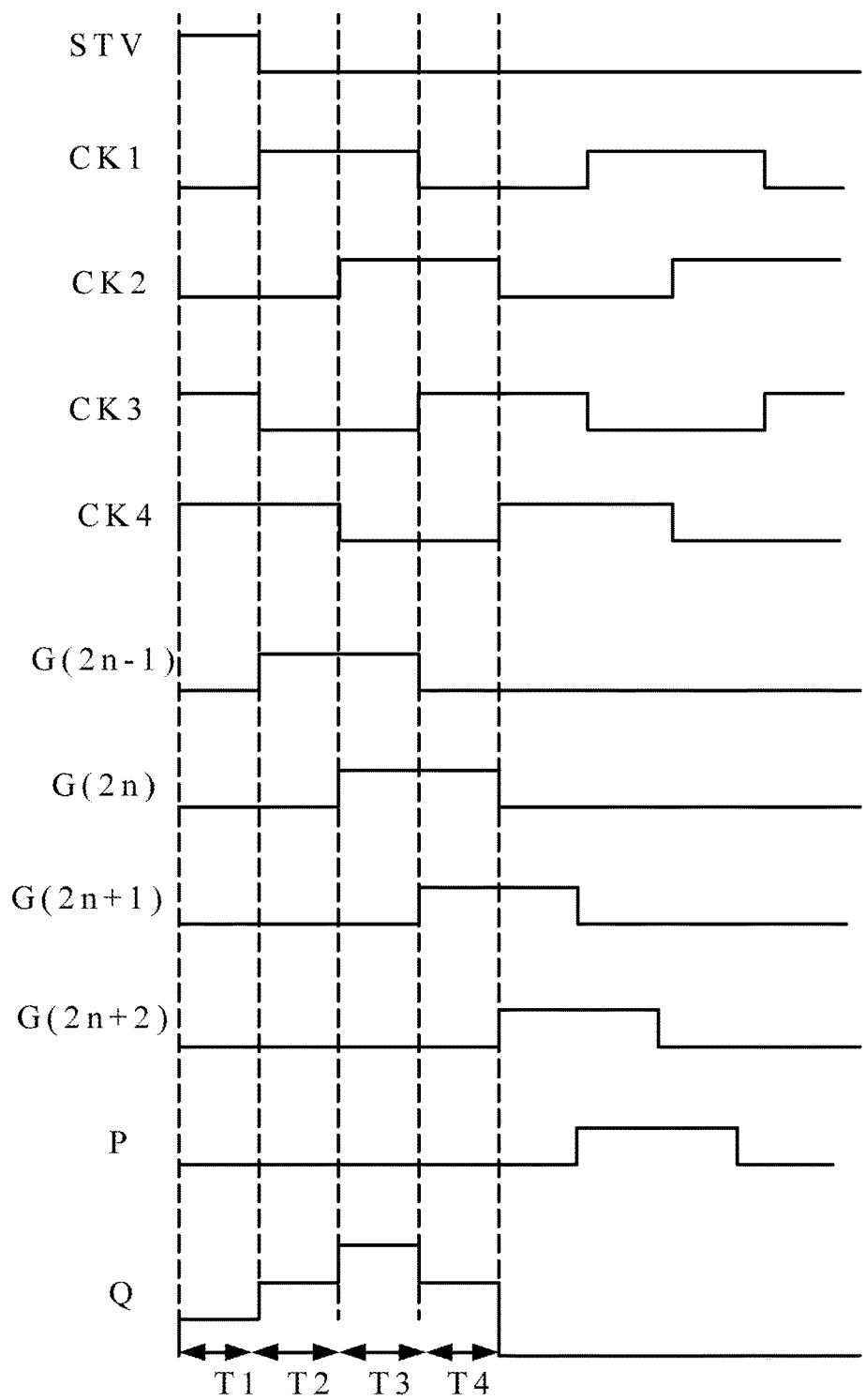
FIG. 3B is a timing diagram illustrating the signal of the shift register circuits shown in FIG. 2A.

Besides, a driving method 300 is proposed in this disclosure. The driving method 300 is configured to drive the shift register circuits 110(1)-110(n) of the driving circuit 100 in, but not limited to, the aforementioned embodiments. Reference is made to FIG. 3A and FIG. 3B. FIG. 3A is a diagram of the driving method 300 according to one embodiment of the disclosure, and FIG. 3B is a timing diagram of the signal of the N-th stage shift register circuit 200 shown in FIG. 2A.

Operation S310 of the driving method 300 is performed. In a first time interval T1, the enabling control unit 210 configures the first operation node Q to a first enabling level according to the enabling signal STV. As shown in FIG. 3B, in the first time interval T1, the enabling signal STV is at logic-high level, and the first transistor M1 is hence turned on and raise the voltage level of the first operation node Q to the first enabling level. The first enabling level is the voltage level of the first operation voltage FW, and as mentioned above, the first operation voltage FW can be at logic-high level. It is noted that, although the first operation node Q is at logic-high level during the first time interval T1, the first clock signal CK1 and the second clock signal CK2 is not enabled. Thus, the third transistor M3 and the fourth transistor M4 does not generate the first driving signal G(2n−1) and the second driving signal G(2n).

Operation S320 of the driving method 300 is performed. In a second time interval T2 after the first time interval T1, the first output unit 220 generates the first driving signal G(2n−1) at the output terminal of the first output unit 220 and configures the first operation node Q to a second enabling level by enabling the first clock signal CK1. As shown in FIG. 3B, in the second time interval T2 after the first time interval T1, the first clock signal CK1 is at logic-high level, thus the first terminal of the third transistor M3 generates a logic-high first driving signal G(2n−1). Meanwhile, due to the coupling effect of capacitors, the first capacitor C1, the second capacitor C2 and the Input capacitance Cgs3 of the third transistor M3 and the Input capacitance Cgs4 of the fourth transistor M4 further raise the voltage level of the first operation node Q from logic-high level to the second enabling level, which is about twice as high as the logic-high level. Note that, even if the driving method 300 is applied to the N-th stage shift register circuit 200' in FIG. 2B, the Input capacitance Cgs3 of the third transistor M3 and the Input capacitance Cgs4 of the fourth transistor M4 is still enough to raise the voltage level of the first operation node Q from logic-high level to the second enabling level.

Operation S330 of the driving method 300 is performed. In a third time interval T3 after the second time interval T2, the second output unit 230 generates the second driving signal G(2n) at the output terminal of the second output unit 230 and configures the first operation node Q to a third enabling level by enabling the second clock signal CK2. As shown in FIG. 3B, in the third time interval T3 after the second time interval T2, the second clock signal CK2 is at logic-high level, thus the first terminal of the fourth transistor M4 generates a logic-high first driving signal G(2n). Namely, due to the coupling effect of capacitors, the first capacitor C1, the second capacitor C2 and the input capacitance Cgs3 of the third transistor M3 and the input capacitance Cgs4 of the fourth transistor M4 further raise the voltage level of the first operation node Q from second enabling level to the third enabling level, which is about three times as high as the logic-high level.

Operation S340 of the driving method 300 is performed. In a fourth time interval T4 after the third time interval T3, the first operation node Q is configured to the second enabling level by disabling the first clock signal CK1. As shown in FIG. 3B, in the fourth time interval T4 after the third time interval T3, the first clock signal CK1 is switched from logic-high level to logic-low level thus the third transistor M3 stops generating the first driving signal G(2n−1). Besides, because the first clock signal CK1 and the third clock signal CK3 are complementary, when the first clock signal CK1 is switched from logic-high level to logic-low level, the third clock signal CK3 will be switched from logic-low level to logic-high level, and the voltage level of the output terminal of the first output unit 220 will maintain at the reference voltage level VSS via the sixth transistor M6. On the other hand, the second clock signal CK2 maintains at logic-high level at this moment, thus through the coupling effect of capacitors, the voltage level of the first operation node Q is pulled low from the third enabling level to the second enabling level, which is twice as high as the logic-high level.

Operation S350 of the driving method 300 is performed. After the fourth time interval T4, the disabling control unit 240 is driven by the first clock signal CK1 to maintain the voltage level of first operation node Q at the reference voltage level VSS. As shown in FIG. 3B, after the fourth time interval T4, the second clock signal CK2 is switched from logic-high level to logic-low level thus the fourth transistor M4 stops generating the second driving signal G(2n). In addition, since the second clock signal CK2 and the fourth clock signal CK4 are complementary, when the second clock signal CK2 is switched from logic-high level to logic-low level, the fourth clock signal CK4 will be switched from logic-low level to logic-high level, and the voltage level of the output terminal of the second output unit 230 will maintain at the reference voltage level VSS via the eighth transistor M8. On the other hand, since the shift register in this stage has successfully output the first driving signal G(2n−1) and the second driving signal G(2n), the voltage level of the first operation node Q is not necessary to maintain at logic-high level. Thus, the voltage level of the first operation node Q is pulled low to the reference voltage level VSS via the reset signal RST, and the voltage level of the first operation node Q maintains at the reference voltage level VSS by the first clock signal CK1.

As additional remarks, in some embodiments, the driving method 300 still includes step S360 (not shown in figures): In the fourth time interval T4, the shift register in the next step generates corresponding first driving signal G(2n+1). As previously mentioned, in some embodiments, the second driving signal G(2)-G(2n) in each stage of the shift register circuits 110(1)-110(n) is the enabling signal STV in the next stage. Therefore, if the second driving signal G(2n) enabled in the third time interval T3 is regarded as the enabling signal STV in the next stage, e.g., (N+1)th stage (not shown in figures), then in the third time interval T3, the corresponding first driving signal G(2n−1) in the next stage, i.e., (N+1)th stage, will be generated.

To conclude, outputting at least two driving signals are generated in a single stage by sharing the enabling control unit and disabling control unit in the same stage of the shift register circuits. Moreover, in some embodiments, the circuit area can be substantially reduced through decreasing the number of capacitors in output units.

Based on the abovementioned contents and embodiments, this disclosure provides a detection apparatus. By using the detection apparatus, lighting detection and short circuit detection for the divided partitions of the touch display panel can be conducted.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A driving circuit, comprising:
plural stages of shift register circuits configured for generating a plurality of driving signals sequentially, each stage of the shift register circuits comprising:
an enabling control unit configured to control a voltage level of a first operation node according to an enabling signal;
a first output unit electrically coupled to the first operation node, the first output unit being configured to generate a first driving signal at an output terminal of the first output unit according to the voltage level of the first operation node and a first clock signal;
a second output unit electrically coupled to the first operation node, the second output unit being configured to generate a second driving signal at an output terminal of the second output unit according to the voltage level of the first operation node and a second clock signal; and
a disabling control unit electrically coupled to the first output unit and the second output unit, the disabling control unit being configured to pull low the voltage levels of the first operation node, the output terminal of the first output unit and the output terminal of the second output unit to a reference voltage level according to the first clock signal, a third clock signal and a fourth clock signal,
wherein the first clock signal and the third clock signal are complementary to each other, and the second clock signal and the fourth clock signal are complementary to each other.

2. The driving circuit of claim 1, wherein the second driving signal in each stage of the shift register circuits is the enabling signal in the next stage of the shift register circuits.

3. The driving circuit of claim 1, wherein the enabling control unit is configured to control the voltage level of the first operation node further according to a reset signal.

4. The driving circuit of claim 3, wherein the second driving signal in each stage of the shift register circuits is the reset signal in the previous stage of the shift register circuits.

5. The driving circuit of claim 4, wherein the enabling control unit comprises:
a first transistor, wherein a control terminal of the first transistor is configured to receive the enabling signal, a first terminal of the first transistor is electrically coupled to the first operation node, and a second terminal of the first transistor is configured to receive a first operation voltage; and
a second transistor, wherein a control terminal of the second transistor is configured to receive the reset signal, a first terminal of the second transistor is electrically coupled to the first operation node, and a second terminal of the second transistor is configured to receive a second operation voltage.

6. The driving circuit of claim 1, wherein the first output unit further comprises a third transistor, a control terminal of the third transistor is electrically coupled to the first operation node, a first terminal of the third transistor is electrically coupled to the disabling control unit, and a second terminal of the third transistor is configured to receive the first clock signal, and
the second output unit further comprises a fourth transistor, a control terminal of the fourth transistor is electrically coupled to the first operation node, a first terminal of the fourth transistor is electrically coupled to the disabling control unit, and a second terminal of the fourth transistor is configured to receive a second clock signal.

7. The driving circuit of claim 6, wherein the first output unit further comprises a first capacitor in the first output unit, a first terminal of the first capacitor is electrically coupled to the control terminal of the third transistor, and a second terminal of the first capacitor is electrically coupled to the first terminal of the third transistor, and the second output unit further comprises a second capacitor, a first terminal of the second capacitor is electrically coupled to the control terminal of the fourth transistor, and a second terminal of the second capacitor is electrically coupled to the first terminal of the fourth transistor.

8. The driving circuit of claim 1, the disabling control unit further comprises:
   a first disabling circuit, comprising:
      a fifth transistor, wherein a control terminal of the fifth transistor is electrically coupled to a second operation node, a first terminal of the fifth transistor is configured to receive the reference voltage level, and a second terminal of the fifth transistor is electrically coupled to the output terminal of the first output unit; and
      a sixth transistor, wherein a control terminal of the sixth transistor is configured to receive a third clock signal, a first terminal of the sixth transistor is configured to receive the reference voltage level, and a second terminal of the sixth transistor is electrically coupled to the output terminal of the first output unit;
   a second disabling circuit, comprising:
      a seventh transistor, wherein a control terminal of the seventh transistor is electrically coupled to the second operation node, a first terminal of the seventh transistor is configured to receive the reference voltage level, and a second terminal of the seventh transistor is electrically coupled to the output terminal of the second output unit; and
      an eighth transistor, wherein a control terminal of the eighth transistor is electrically coupled to the first operation node, a first terminal of the eighth transistor is configured to receive the reference voltage level, and a second terminal of the eighth transistor is electrically coupled to the output terminal of the second output unit; and
   a third disabling circuit, comprising:
      a ninth transistor, wherein a control terminal of the ninth transistor is electrically coupled to the first operation node, a first terminal of the ninth transistor is configured to receive the reference voltage level, and a second terminal of the ninth transistor is electrically coupled to the second operation node;
      a tenth transistor, wherein a control terminal of the tenth transistor is electrically coupled to the second operation node, a first terminal of the tenth transistor is configured to receive the reference voltage level, and a second terminal of the tenth transistor is electrically coupled to the first operation node; and
      a third capacitor, wherein a first terminal of the third capacitor is electrically coupled to the second operation node, and a second terminal of the third capacitor is configured to receive the first clock signal.

9. A driving method, suitable for driving the plural stages of the shift register circuits in the driving circuit of claim 1, the driving method comprising:
   in a first time interval, driving the enabling control unit by the enabling signal for configuring the first operation node to a first enabling level;
   in a second time interval after the first time interval, enabling the first clock signal for triggering the first output unit to generate a first driving signal at the output terminal of the first output unit, and configuring the first operation node to a second enabling level;
   in a third time interval after the second time interval, enabling the second clock signal for triggering the second output unit to generate a second driving signal at the output terminal of the second output unit, and configuring the first operation node to a third enabling level;
   in a fourth time interval after the third time interval, disabling the third clock signal for configuring the first operation node to the second enabling level; and
   after the fourth time interval, pulling low the voltage level of the first operation node to the reference voltage level by the reset signal, and disabling the control unit by the first clock signal so as to maintain the first operation node at the reference voltage level.

10. The driving method of claim 9, wherein the second driving signal in each stage of the shift register circuits is the enabling signal in the next stage of the shift register circuits, and in the fourth time interval, the corresponding first driving signal is generated by the shift register circuits in the next stage.

* * * * *